US012648166B2

(12) United States Patent
Chen et al.

(10) Patent No.: US 12,648,166 B2
(45) Date of Patent: Jun. 2, 2026

(54) SEMICONDUCTOR DEVICE AND METHOD FOR MANUFACTURING THE SAME

(71) Applicant: UNITED MICROELECTRONICS CORP., Hsinchu (TW)

(72) Inventors: Yen-Hsing Chen, Taipei City (TW); Chun-Liang Kuo, Kaohsiung City (TW); Tsung-Mu Yang, Tainan City (TW); Yu-Ren Wang, Tainan City (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 857 days.

(21) Appl. No.: 17/565,991

(22) Filed: Dec. 30, 2021

(65) Prior Publication Data

US 2023/0163205 A1    May 25, 2023

(30) Foreign Application Priority Data

Nov. 25, 2021    (TW) ................................. 110143986

(51) Int. Cl.
*H10D 30/47* (2025.01)
*H10D 30/01* (2025.01)
*H10D 62/824* (2025.01)
*H10D 62/85* (2025.01)

(52) U.S. Cl.
CPC ......... *H10D 30/475* (2025.01); *H10D 30/015* (2025.01); *H10D 62/824* (2025.01); *H10D 62/8503* (2025.01)

(58) Field of Classification Search
None
See application file for complete search history.

(56) References Cited

U.S. PATENT DOCUMENTS

| | | | |
|---|---|---|---|
| 10,014,402 B1 | 7/2018 | Chen et al. | |
| 2015/0123139 A1 | 5/2015 | Kim et al. | |
| 2019/0013399 A1 | 1/2019 | Liu et al. | |

*Primary Examiner* — Jack S Chen

(74) *Attorney, Agent, or Firm* — WPAT, PC

(57) ABSTRACT

A semiconductor device and a method for manufacturing the same are provided. The semiconductor device includes a substrate, a channel layer on the substrate, a first barrier layer on the channel layer, a second barrier layer on the first barrier layer, and a gate element on the second barrier layer. The first barrier layer includes a first material with a first band gap, the second barrier layer includes a second material with a second band gap, and the first band gap is greater than the second band gap.

16 Claims, 12 Drawing Sheets

1

SEMICONDUCTOR DEVICE AND METHOD FOR MANUFACTURING THE SAME

This application claims the benefit of Taiwan application Serial No. 110143986, filed Nov. 25, 2021, the subject matter of which is incorporated herein by reference.

BACKGROUND

Technical Field

The disclosure relates to a semiconductor device and a method for manufacturing the same, and more particularly to a semiconductor device including a high electron mobility transistor (HEMT) structure and a method for manufacturing the same.

Description of the Related Art

Semiconductor devices including high electron mobility transistors have been widely used in various applications in recent years. Specifically, the high electron mobility transistors include two-dimensional electron gas (2-DEG) with high electron mobility, making these semiconductor devices suitable for various high-speed and high-power electronic components.

The electrical performance of the high electron mobility transistor is usually related to the barrier layer of the high electron mobility transistor. For example, a barrier layer with a lower thickness may have a lower content of two-dimensional electron gas, and may result in problems such as high on-resistance ($R_{on}$). However, if a thickness of a barrier layer is increased to prevent the problem of high on-resistance, it may result in problems such as difficulty in turning off the transistor and additional power consumption.

It is desirable to provide a new semiconductor device including a high electron mobility transistor structure which is easy to control and has low on-resistance.

SUMMARY

The present disclosure relates to a semiconductor device and a method for manufacturing the same.

According to an embodiment of the present disclosure, a semiconductor device is provided. The semiconductor device includes a substrate, a channel layer on the substrate, a first barrier layer on the channel layer, a second barrier layer on the first barrier layer, and a gate element on the second barrier layer. The first barrier layer includes a first material with a first band gap, the second barrier layer includes a second material with a second band gap, and the first band gap is greater than the second band gap.

According to an embodiment of the present disclosure, a method for manufacturing a semiconductor device is provided. The method includes: providing a substrate; forming a channel layer on the substrate; forming a first barrier layer on the channel layer; forming a second barrier layer on the first barrier layer; removing part of the second barrier layer to expose the first barrier layer; forming a gate element on the second barrier layer. The first barrier layer includes a first material with a first band gap, the second barrier layer includes a second material with a second band gap, and the first band gap is greater than the second band gap.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Figure 1:
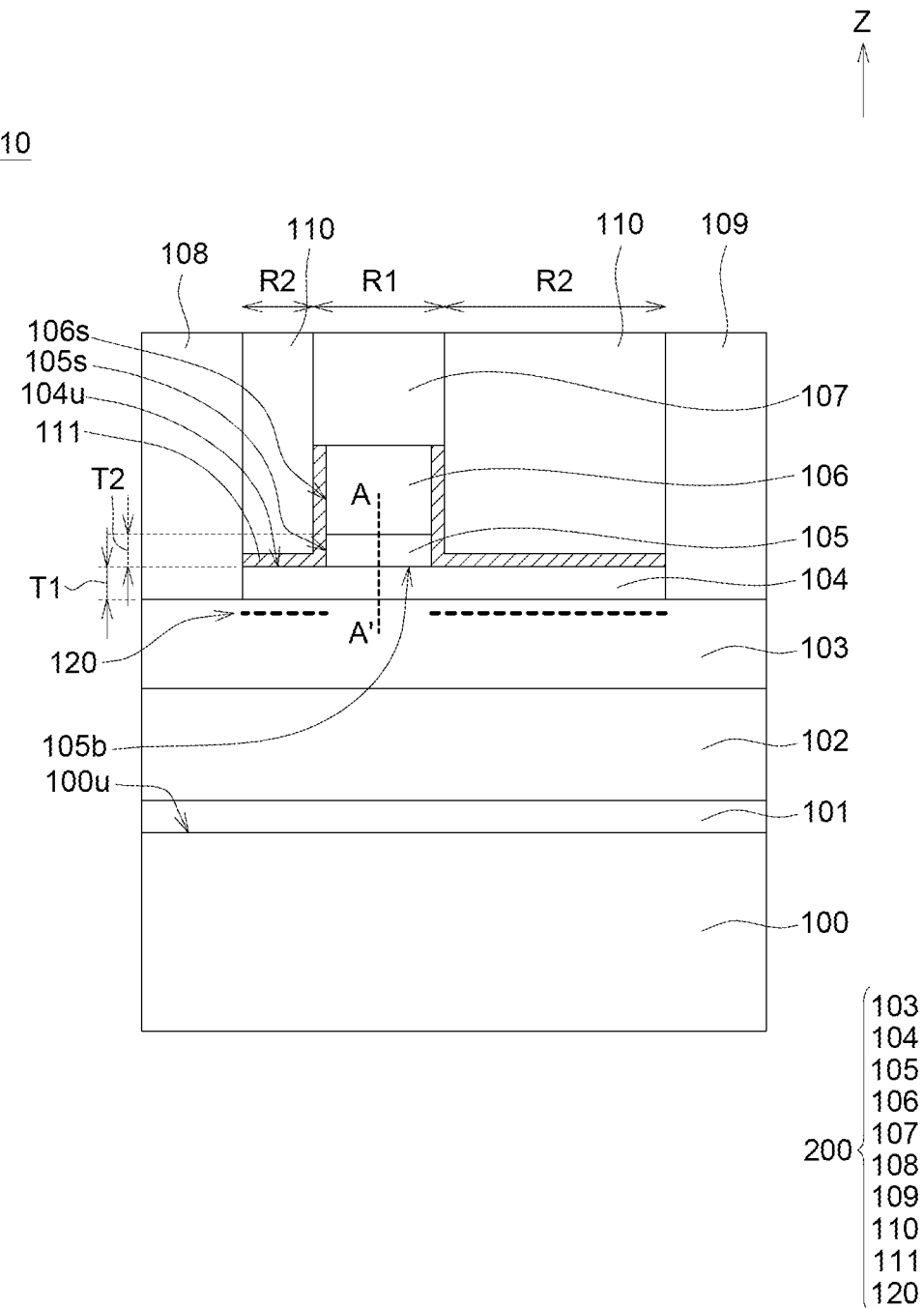
FIG. 1 schematically illustrates a semiconductor device according to an embodiment of the present disclosure.

FIG. 1 schematically illustrates a semiconductor device 10 according to an embodiment of the present disclosure. The semiconductor device 10 includes a substrate 100, a transistor structure 200 on the substrate 100 along a Z direction, a nucleation layer 101 and a buffer layer 102. The nucleation layer 101 and the buffer layer 102 are between the substrate 100 and the transistor structure 200. The nucleation layer 101 may be on the substrate 100. The buffer layer 102 may be on the nucleation layer 101. The Z direction may be, for example, a normal direction of an upper surface 100u of the substrate 100.

The transistor structure 200 may include a channel layer 103, a first barrier layer 104, a second barrier layer 105, a control layer 106, a gate element 107, a source/drain element 108, and a source/drain element 109.

The channel layer 103 is on the buffer layer 102. The first barrier layer 104 is on the channel layer 103. For example, the first barrier layer 104 may contact directly the channel layer 103. The second barrier layer 105 is on the first barrier layer 104. The second barrier layer 105 may not completely cover the first barrier layer 104. The source/drain element 108 and the source/drain element 109 are on the channel layer 103. The source/drain element 108 and the source/drain element 109 are on opposite sides of the first barrier layer 104. The gate element 107 is on the second barrier layer 105 and between the source/drain element 108 and the source/drain element 109. The control layer 106 is on the second barrier layer 105 and between the second barrier layer 105 and the gate element 107.

The transistor structure 200 may further include a dielectric layer 110 and a passive layer 111. The passive layer 111 may be on a sidewall 105$s$ of the second barrier layer 105, a sidewall 106$s$ of the control layer 106, and an upper surface 104$u$ of the first barrier layer 104. The dielectric layer 110 may be on the passive layer 111. The dielectric layer 110 may be between the gate element 107 and the source/drain element 108, and between the gate element 107 and the source/drain element 109. In the transistor structure 200, a portion of the channel layer 103 under the dielectric layer 110 may be defined as an access region R2, and a portion of the channel layer 103 under the gate element 107 may be defined as a gate region R1.

The transistor structure 200 may further include a carrier channel 120 (represented by lateral dashed lines in FIG. 1). The carrier channel 120 may be formed near an interface between the channel layer 103 and the first barrier layer 104. The carrier channel 120 may be also known as two-dimensional electron gas (2-DEG). For example, the transistor structure 200 may be a high electron mobility transistor structure. In an embodiment, the transistor structure may be an enhancement-mode high electron mobility transistor structure or a normally-off high electron mobility transistor structure, the control layer 106 can be used to deplete the carrier channel 120 in the gate region R1 to turn off the transistor structure 200 when no voltage is applied to the gate element 107 (as shown in FIG. 1, there is no carrier channel 120 in the gate region R1 when no voltage is applied to the gate element 107); when a voltage is applied to the gate element 107, the carrier channel 120 in the gate region R1 can be restored and the carrier channel 120 extends through the gate region R1 and the access region R2 (not shown), thereby turning on the transistor structure 200.

The first barrier layer 104 may include a first material. The second barrier layer 105 may include a second material. The first material may be different from the second material. For example, the first material of the first barrier layer 104 may include AlN, GaN, InN, AlGaN, AlInN, GaInN or AlGaInN. The second material of the second barrier layer 105 may include AlN, GaN, InN, AlGaN, AlInN, GaInN or AlGaInN.

In an embodiment, the first material of the first barrier layer 104 may have a first band gap, the second material of the second barrier layer 105 may have a second band gap, and the first band gap is greater than the second band gap. The first band gap of the first material may be, for example, between 3.8 electron volts (eV) and 6.2 eV. The second band gap of the second material may be, for example, between 0.65 eV and 3.8 eV.

In an embodiment, the first material of the first barrier layer 104 and the second material of the second barrier layer 105 both include aluminum-containing materials, the first barrier layer 104 has a first aluminum content, the second barrier layer 105 has a second aluminum content, and the first aluminum content is different from the second aluminum content. The first aluminum content and the second aluminum content will become better understood with regard to the following description and FIGS. 1 and 2A-2C.

Figure 2A:
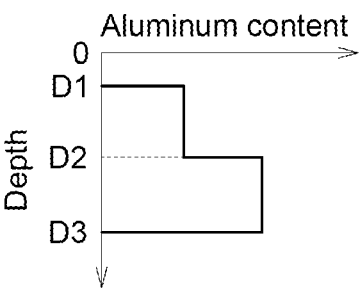
FIG. 2A is a graph showing aluminum content in the semiconductor device according to an embodiment of the present disclosure.
Figure 2B:
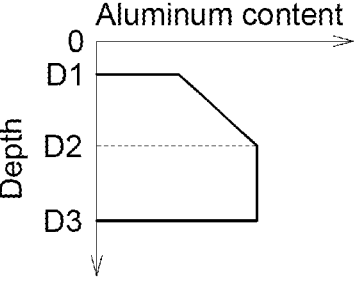
FIG. 2B is a graph showing aluminum content in the semiconductor device according to an embodiment of the present disclosure.
Figure 2C:
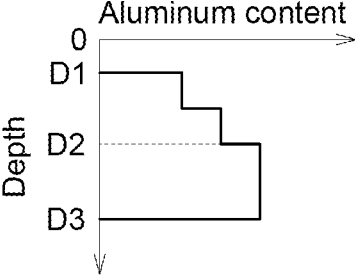
FIG. 2C is a graph showing aluminum content in the semiconductor device according to an embodiment of the present disclosure.

Please refer to FIGS. 1 and 2A-2C. FIGS. 2A-2C are graphs showing aluminum content in the semiconductor device 10 according to different embodiments measured along an extending line AA' in FIG. 1, for example, by fluorescence spectrometry or energy dispersive X-ray spectroscopy. In these embodiments, an endpoint A of the extending line AA' in FIG. 1 is in the control layer 106, an endpoint A' of the extending line AA' in FIG. 1 is in the channel layer 103, and the extending line AA' may extend approximately along the Z direction. In FIGS. 2A-2C, the vertical axes show depths in the Z direction (distances from the endpoint A of the extending line AA' in FIG. 1 in the Z direction), and the horizontal axes show aluminum content of the element in the extending line AA'. For example, the aluminum content may refer to atomic percent (atomic %). The depth D1 may correspond approximately to an interface between the control layer 106 and the second barrier layer 105. The depth D2 may correspond approximately to an interface between the second barrier layer 105 and the first barrier layer 104. The depth D3 may correspond approximately to an interface between the first barrier layer 104 and the channel layer 103. The aluminum content of a portion from depth D1 to depth D2 may be defined as the second aluminum content. The aluminum content of a portion from depth D2 to depth D3 may be defined as the first aluminum content.

In the embodiment shown in FIG. 2A, the first aluminum content of the first barrier layer 104 is a constant, and the second aluminum content of the second barrier layer 105 is a constant. The first aluminum content is greater than the second aluminum content.

In the embodiment shown in FIG. 2B, the first aluminum content of the first barrier layer 104 is a constant, and the second aluminum content of the second barrier layer 105 is a variable. The second aluminum content may linearly increases as the depth in the Z direction (distance from the endpoint A of the extending line AA' in FIG. 1 in the Z direction) increases. The second aluminum content may linearly decreases toward the +Z direction. The first aluminum content is greater than the second aluminum content.

In the embodiment shown in FIG. 2C, the first aluminum content of the first barrier layer 104 is a constant, and the second aluminum content of the second barrier layer 105 is a variable. The second aluminum content may stepwise increases as the depth in the Z direction (distance from the endpoint A of the extending line AA' in FIG. 1 in the Z direction) increases. The second aluminum content may stepwise decreases toward the +Z direction. The term "stepwise increase" used herein may mean that the aluminum content in a first depth range of the second barrier layer 105 is the same and the aluminum content in a second depth range of the second barrier layer 105 are the same, but the aluminum content in a first depth range is different from the aluminum content in a second depth range. The first aluminum content is greater than the second aluminum content.

In an embodiment, the first material of the first barrier layer 104 may include $Al_aGa_{1-a}N$, the second material of the second barrier layer 105 may include $Al_bGa_{1-b}N$, and a is greater than b (a>b). For example, a may be greater than or equal to 0.20 (a≥0.20), and b may be smaller than 0.20 (b<0.20). Alternatively, a may be greater than or equal to 0.18 (a≥0.18), and b may be smaller than 0.18 (b<0.18). Alternatively, a may be less than or equal to 0.30 and greater than or equal to 0.18 (0.30≥a≥0.18), and b may be smaller than 0.18 and greater than or equal to 0.10 (0.18>b≥0.10).

In an embodiment, a and b may be constants. In an embodiment, a may be a constant, and b may linearly decrease from a bottom surface 105$b$ of the second barrier layer 105 toward a direction away from the first barrier layer 104 (or may be understood as toward the +Z direction in this embodiment). In an embodiment, a may be a constant, and b may stepwise decrease from the bottom surface 105$b$ of the second barrier layer 105 toward a direction away from the first barrier layer 104 (or may be understood as toward the +Z direction in this embodiment).

For example, in an embodiment, the first material of the first barrier layer 104 may include $Al_aGa_{1-a}N$, the second material of the second barrier layer 105 may include $Al_bGa_{1-b}N$, a and b are constants, a is equal to 0.22, and b is equal to 0.15.

Please refer back to FIG. 1. The first barrier layer 104 may have a first thickness T1 in the Z direction, and the second barrier layer 105 may have a second thickness T2 in the Z direction. The second thickness T2 may be smaller than the first thickness T1. In an embodiment, the first thickness T1 of the first barrier layer 104 may be between 10 nm and 20 nm, for example, the first thickness T1 may be 15 nm; the second thickness T2 of the second barrier layer 105 may be between 1 nm and 10 nm, for example, the second thickness T2 may be 4 nm.

Figure 3:
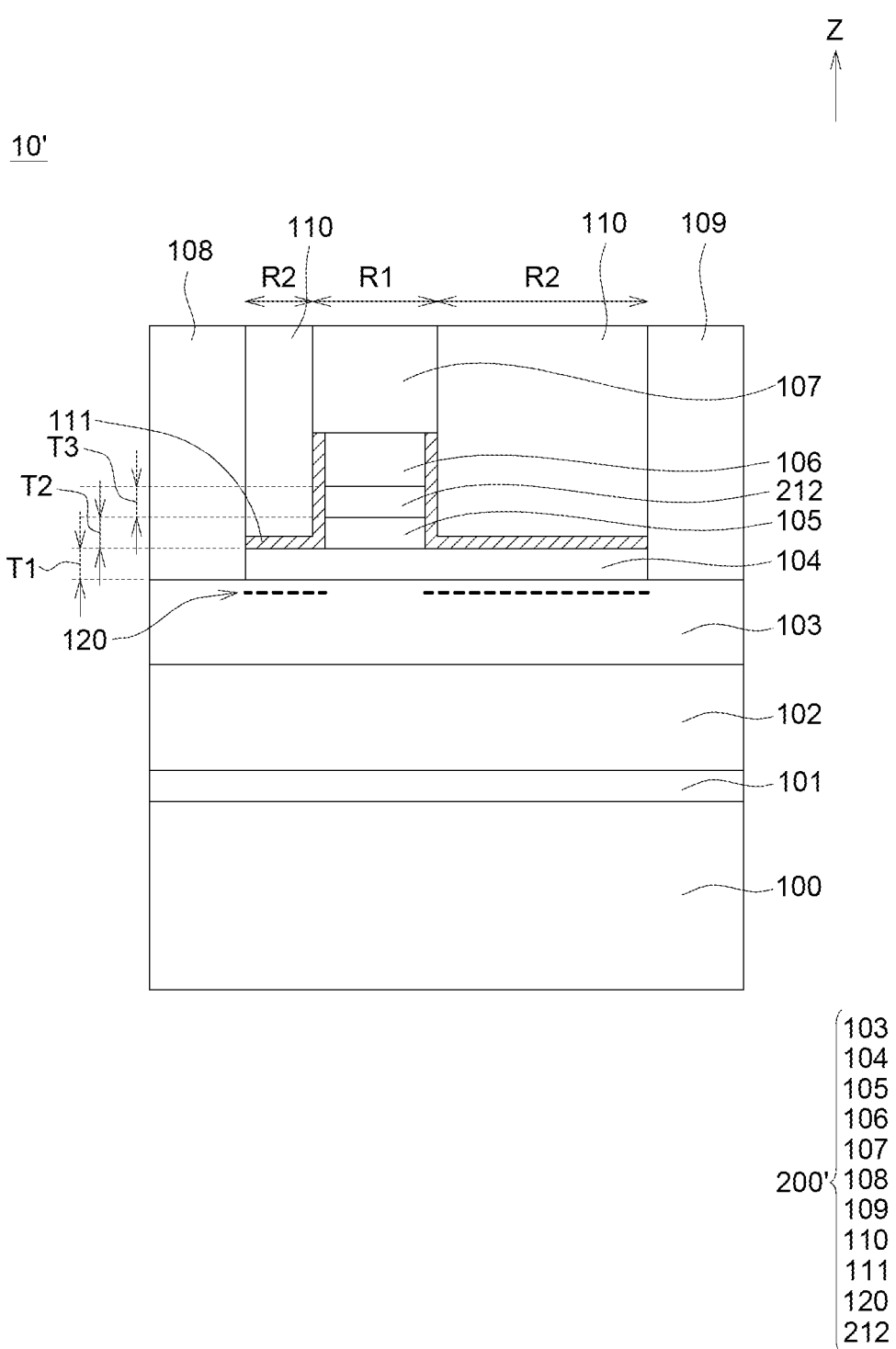
FIG. 3 schematically illustrates a semiconductor device according to another embodiment of the present disclosure.

In the embodiment shown in FIG. 1, the transistor structure 200 of the semiconductor device 10 includes two barrier layers (the first barrier layer 104 and the second barrier layer 105). The present disclosure is not limited thereto. The transistor structure of the semiconductor device of the present disclosure may include two or more barrier layers, as shown in FIG. 3. FIG. 3 schematically illustrates a semiconductor device 10' according to another embodiment of the present disclosure. The difference between the semiconductor device 10' of FIG. 3 and the semiconductor device 10 of FIG. 1 is that the transistor structure 200' of the semiconductor device 10' further includes a third barrier layer 212 on the second barrier layer 105. The second barrier layer 105 may be between the first barrier layer 104 and the third barrier layer 212. The third barrier layer 212 may include a third material. The third material may be different from the first material of the first barrier layer 104. The third material may be the same as or different from the second material of the second barrier layer 105. For example, the third material of the third barrier layer 212 may include AlN, GaN, InN, AlGaN, AlInN, GaInN or AlGaInN.

In an embodiment, the third material of the third barrier layer 212 may have a third band gap. The third band gap of the third material and the second band gap of the second material may be smaller than the first band gap of the first material. For example, the third band gap of the third material may be smaller than the second band gap of the second material, and the second band gap of the second material may be smaller than the first band gap of the first material. For example, the third band gap of the third material may be between 0.65 eV and 3.8 eV.

In an embodiment, all of the first material of the first barrier layer 104, the second material of the second barrier layer 105, and the third material of the third barrier layer 212 include aluminum-containing materials, the first barrier layer 104 has a first aluminum content, the second barrier layer 105 has a second aluminum content, the third barrier layer 212 has a third aluminum content, and the first aluminum content is larger than the second aluminum content and the third aluminum content. For example, the first aluminum content may be larger than the second aluminum content, and the second aluminum content may be larger than the third aluminum content. The first material of the first barrier layer 104 may be a constant, the second material of the second barrier layer 105 may be a constant or a variable, and the third material of the third barrier layer 212 may be a constant or a variable. For example, the second material of the second barrier layer 105 may linearly or stepwise decrease toward the +Z direction; the third material of the third barrier layer 212 may linearly or stepwise decrease toward the +Z direction.

As shown in FIG. 3, the first barrier layer 104 may have a first thickness T1 in the Z direction, the second barrier layer 105 may have a second thickness T2 in the Z direction, and the third barrier layer 212 may have a third thickness T3 in the Z direction. The second thickness T2 and the third thickness T3 may be smaller than the first thickness T1. For example, the third thickness T3 of the third barrier layer 212 may be between 1 nm and 10 nm.

In an embodiment, the transistor structure of the semiconductor device may include more than three barrier layers. In this case, the barrier layer farther from the first barrier layer (which is the barrier layer closest to the channel layer) may have smaller aluminum content. Alternatively, the barrier layer farther from the first barrier layer (which is the barrier layer closest to the channel layer) may include a material with smaller band gap.

FIGS. 4-11 schematically illustrate a method for manufacturing a semiconductor device according to an embodiment of the present disclosure.

Figure 4:
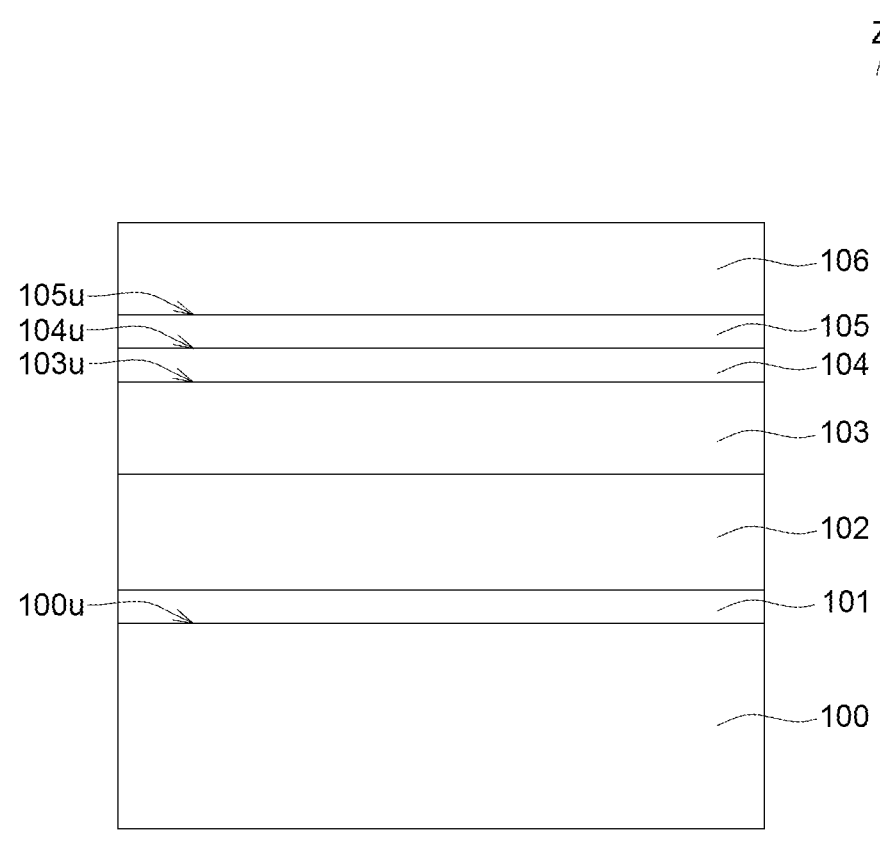
FIGS. 4-11 schematically illustrate a method for manufacturing a semiconductor device according to an embodiment of the present disclosure.

Please refer to FIG. 4, a substrate 100 is provided. The substrate 100 may be a semiconductor substrate, such as a doped or undoped silicon substrate.

A nucleation layer 101, a buffer layer 102 and a channel layer 103 may be formed on an upper surface 100u of the substrate 100 in sequence along the Z direction, for example, by a metal organic chemical vapor deposition (MOCVD) process or a molecular beam epitaxy (MBE) process. The nucleation layer 101 may include AlN. The buffer layer 102 may include AlN, $Al_yGa_{1-y}N$ (0<y<1) or GaN. For example, the buffer layer 102 may include undoped GaN or GaN that is not intentionally doped.

Then, a first barrier layer 104 is formed on an upper surface 103u of the channel layer 103, for example, by a metal organic chemical vapor deposition process or a molecular beam epitaxy process. The first barrier layer 104 may include a first material. The first material of the first barrier layer 104 may include AlN, GaN, InN, AlGaN, AlInN, GaInN or AlGaInN. In an embodiment, the first material of the first barrier layer 104 may include an aluminum-containing material, and the formation of the first barrier layer 104 may include: a precursor including aluminum is provided to the upper surface 103u of the channel layer 103; the precursor including aluminum reacts with other reactants to form the first barrier layer 104. In an embodiment, the first material of the first barrier layer 104 includes $Al_aGa_{1-a}N$, a is larger than 0, and the formation of the first barrier layer 104 include: a precursor including aluminum, a precursor including gallium, and a precursor including nitrogen are provided to the upper surface 103u of the channel layer 103; the precursor including aluminum, the precursor including gallium, and the precursor including nitrogen react to form the first barrier layer 104. In the above embodiment, the concentration of the precursor including aluminum may be a constant, that is, the concentration of the precursor including aluminum would not change with the increase of processing time.

Then, a second barrier layer 105 is formed on an upper surface 104u of the first barrier layer 104, for example, by a metal organic chemical vapor deposition process or a molecular beam epitaxy process. The second barrier layer 105 may include a second material. The second material of the second barrier layer 105 may include AlN, GaN, InN, AlGaN, AlInN, GaInN or AlGaInN. The first material of the first barrier layer 104 may be different from the second material of the second barrier layer 105. In an embodiment, the second material of the second barrier layer 105 may include an aluminum-containing material, and the formation of the second barrier layer 105 may include: a precursor including aluminum is provided to the upper surface 104u of the first barrier layer 104; the precursor including aluminum reacts with other reactants to form the second barrier layer 105. The concentration of the precursor including aluminum may be a constant, that is, the concentration of the precursor including aluminum would not change with the increase of processing time. Alternatively, the concentration of the precursor including aluminum may decrease as the processing time increases. For example, the concentration of the precursor including aluminum may linearly or stepwise decrease, so that the resulting second barrier layer 105 has a second aluminum content that linearly or stepwise decreases toward the +Z direction.

In an embodiment, the second material of the second barrier layer 105 includes $Al_bGa_{1-b}N$, b is larger than 0, and the formation of the second barrier layer 105 may include: a precursor including aluminum, a precursor including gallium, and a precursor including nitrogen are provided to the upper surface 104u of the first barrier layer 104; the precursor including aluminum, the precursor including gallium, and the precursor including nitrogen react to form the second barrier layer 105. The concentration of the precursor including aluminum may be a constant, that is, the concentration of the precursor including aluminum would not change with the increase of processing time. Alternatively, the concentration of the precursor including aluminum may decrease as the processing time increases. For example, the concentration of the precursor including aluminum may linearly or stepwise decrease as the processing time increases, so that b of the resulting second barrier layer 105 linearly or stepwise decreases toward the +Z direction.

A control layer 106 is formed on an upper surface 105u of the second barrier layer 105, for example, by a metal organic chemical vapor deposition process or a molecular beam epitaxy process. The control layer 105 may include GaN doped with p-type dopants. For example, the p-type dopant may be magnesium (Mg). In an embodiment, the formation of the control layer 106 may include: a layer of undoped GaN or GaN that is not intentionally doped is formed by a metal organic chemical vapor deposition process or a molecular beam epitaxy process, and then p-type dopants are introduced into the layer of undoped GaN or GaN that is not intentionally doped by an implantation process or other suitable doping method to form the control layer 106. In an embodiment, the formation of the control layer 106 may include an annealing process for activating the p-type dopants.

Figure 5:
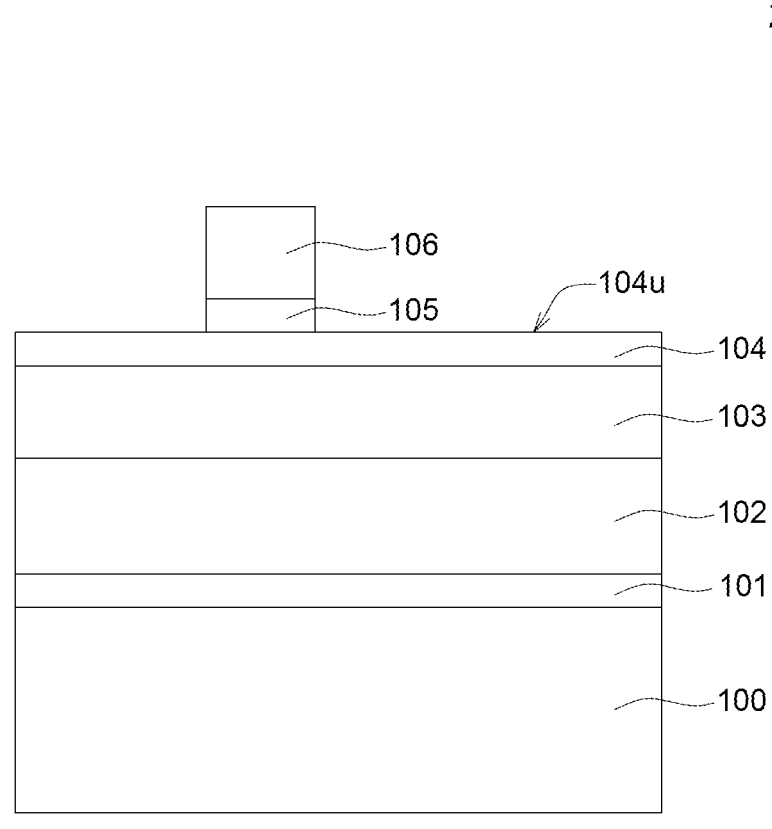

Please refer to FIG. 5, a patterning process is performed to the semiconductor material stack shown in FIG. 4, and part of the control layer 106 and part of the second barrier layer 105 are removed by a wet etching process or a dry etching process to expose part of the upper surface 104u of the first barrier layer 104. In an embodiment, the second barrier layer 105 may be used as an etching sacrificial layer during the etching process for protecting the first barrier layer 104 from being damaged during the etching process. That is, the thickness of the first barrier layer 104 in the Z direction can be approximately the same before and after the etching process.

Figure 6:
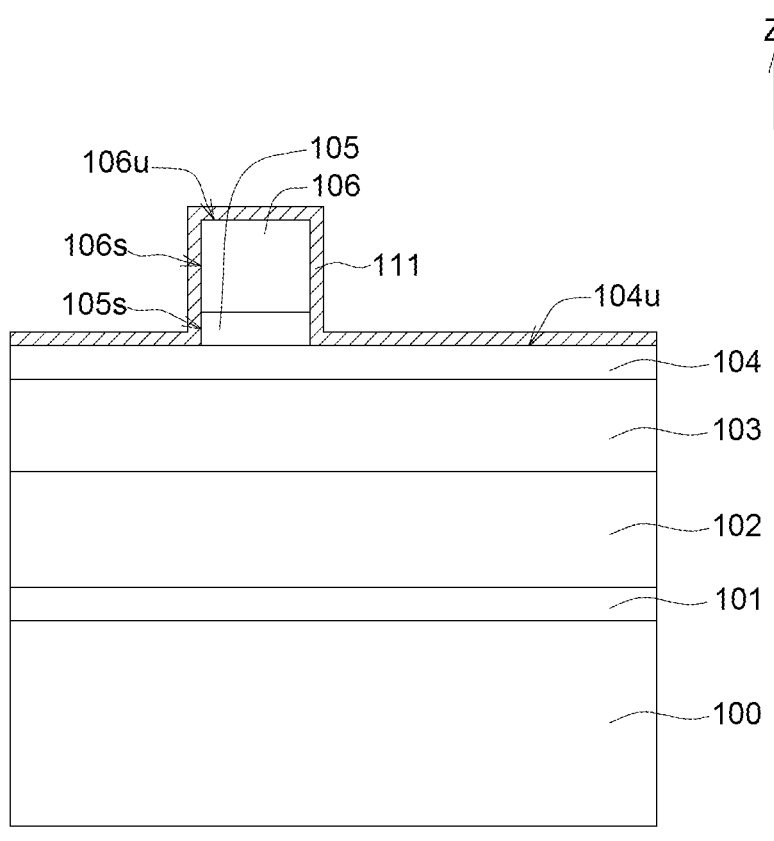

Please refer to FIG. 6, a passive layer 111 is formed on a sidewall 105s of the second barrier layer 105, a sidewall 106s and an upper surface 106u of the control layer 106, and an exposed upper surface 104u of the first barrier layer 104, for example, by a chemical vapor deposition (CVD) process or a physical vapor deposition (PVD) process. The passive layer 111 may include silicon dioxide ($SiO_2$), aluminum nitride, aluminum oxide ($Al_2O_3$), etc.

Figure 7:
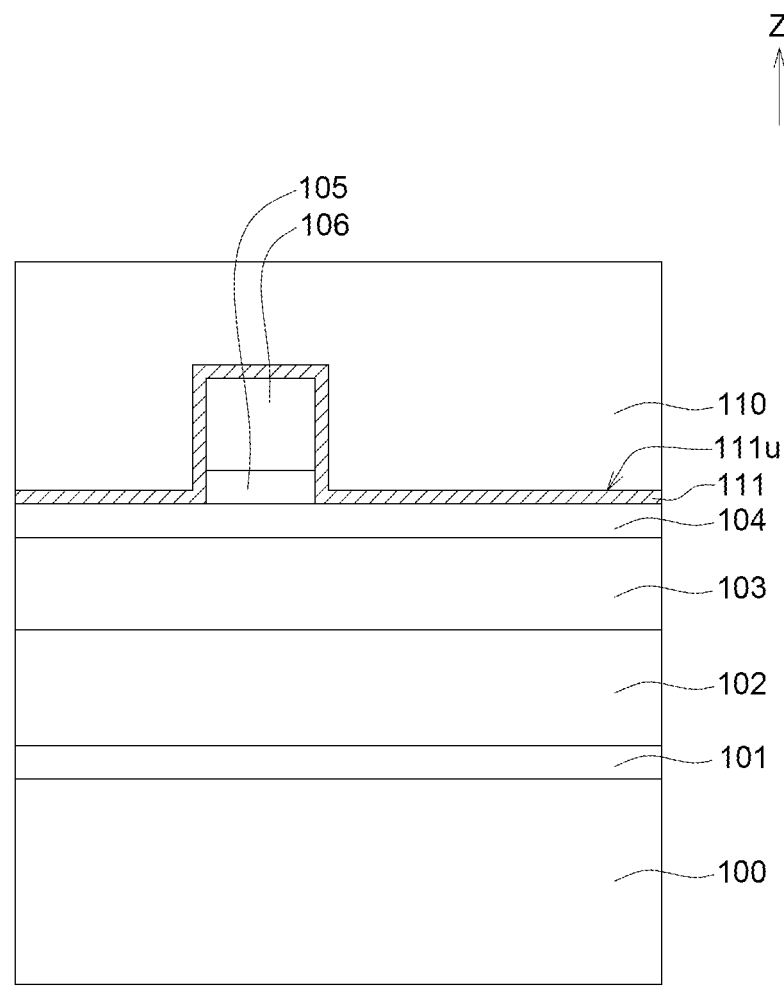

Please refer to FIG. 7, a dielectric layer 110 is then formed on an upper surface 111u of the passive layer 111, for example, by a chemical vapor deposition process or a physical vapor deposition process. The dielectric layer 110 may include a dielectric material, such as silicon nitride ($SiN_x$), silicon oxide ($SiO_x$), etc.

Figure 8:
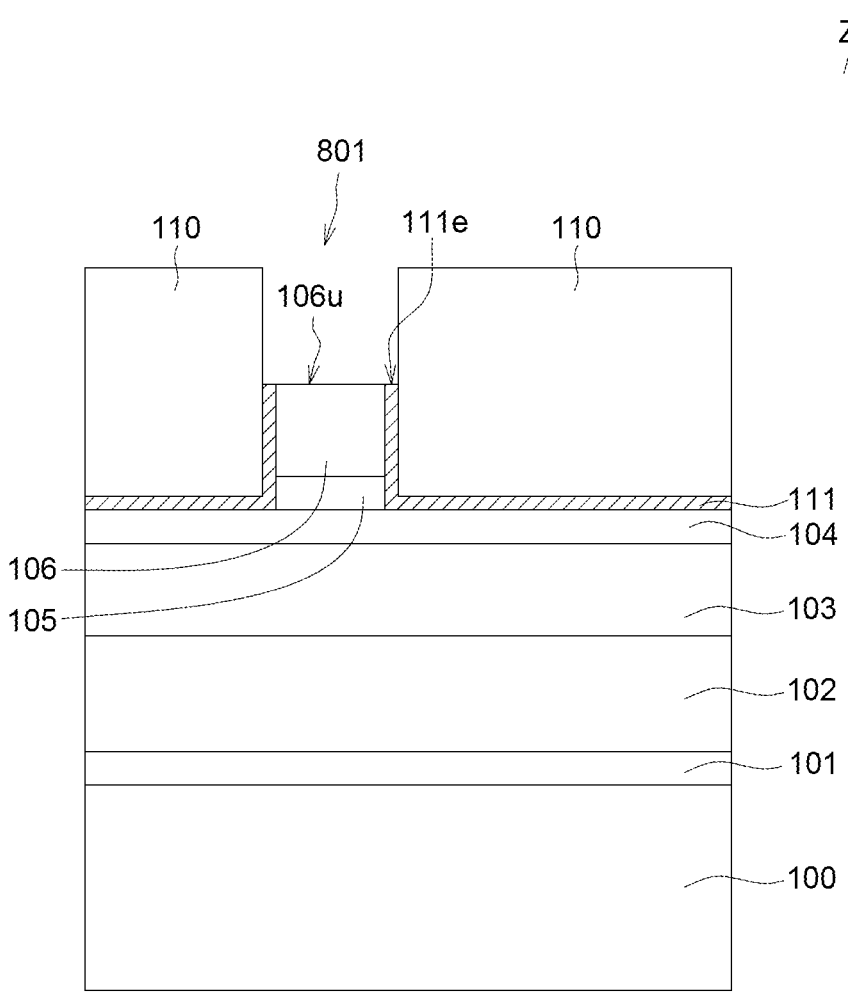

Please refer to FIG. 8, an etching process, such as a wet etching process or a dry etching process, is performed to the dielectric layer 110 to remove the dielectric layer 110 and the passive layer 111 on the upper surface 106u of the control layer 106 to form an opening 801. The upper surface 106u of the control layer 106 and the end portion 111e of the passive layer 111 are exposed at the bottom of the opening 801. The dielectric layer 110 is exposed on the sidewall of the opening 801. The opening 801 may be approximately aligned with the position of the control layer 106.

Figure 9:
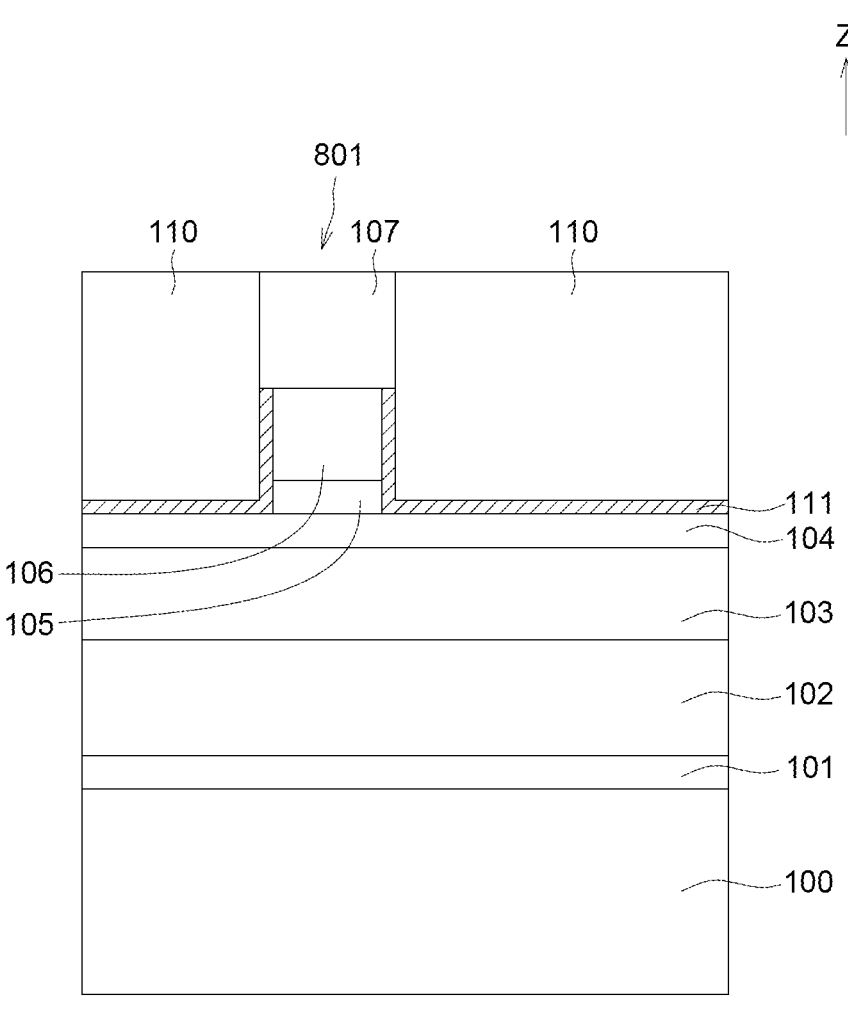

Please refer to FIG. 9, a gate element 107 is formed in the opening 801, for example, by a chemical vapor deposition process or a physical vapor deposition process. In an embodiment, the gate element 107 fills the opening 801, and the gate element 107 may directly contact the dielectric layer 110, the control layer 106 and the passive layer 111. The gate element 107 may include a conductive material, such as aluminum (Al), copper (Cu), nickel (Ni), platinum (Pt), palladium (Pd), iridium (Ir), molybdenum (Mo), gold (Au), titanium (Ti) or titanium nitride (TiN).

Figure 10:
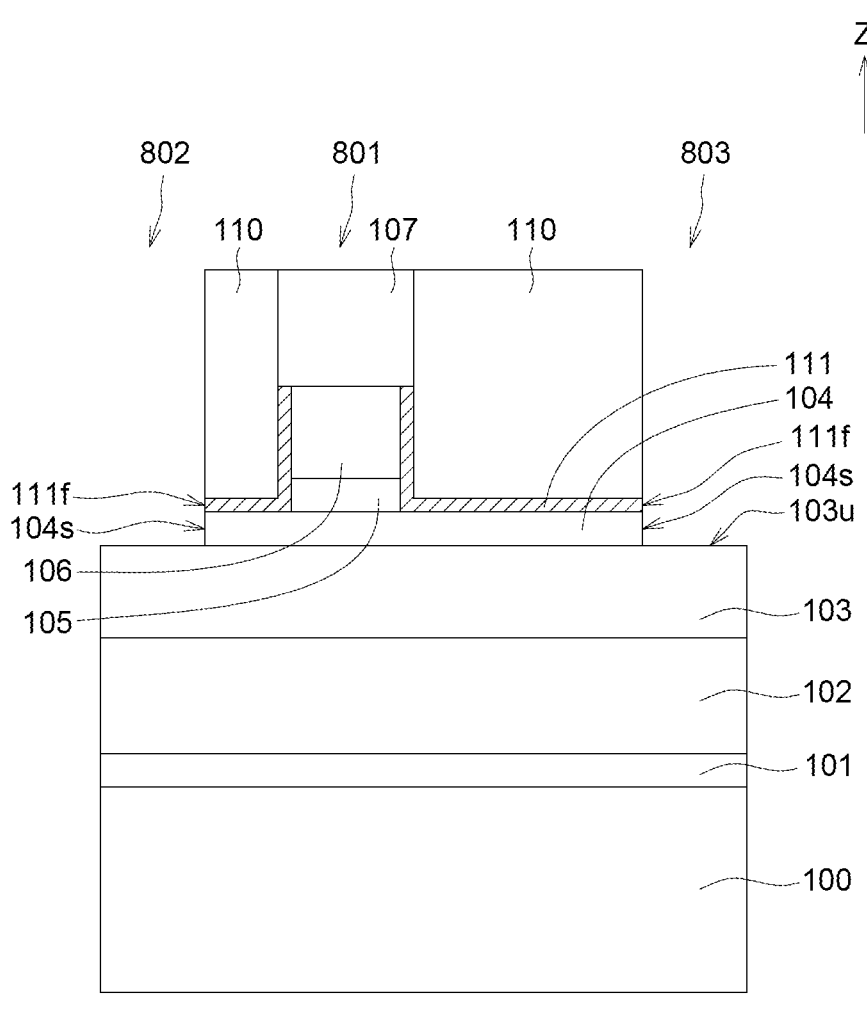

Please refer to FIG. 10, an etching process, such as a wet etching process or a dry etching process, is performed to the dielectric layer 110 to remove part of the dielectric layer 110, part of the passive layer 111 and part of the first barrier layer 104 to form an opening 802 and an opening 803. The openings 802 and 803 may be on opposite sides of the opening 801. The upper surface 103u of the channel layer 103 is exposed at the bottom of the opening 802. The dielectric layer 110, the end portion 111f of the passive layer 111 and the sidewall 104s of the first barrier layer 104 are exposed on the sidewall of the opening 802. The upper surface 103u of the channel layer 103 is exposed at the bottom of the opening 803. The dielectric layer 110, the end portion 111f of the passive layer 111 and the sidewall 104s of the first barrier layer 104 are exposed on the sidewall of the opening 803. In an embodiment, a lateral distance between the opening 802 and the opening 801 may be the same as or different from a lateral distance between the opening 803 and the opening 801.

Figure 11:
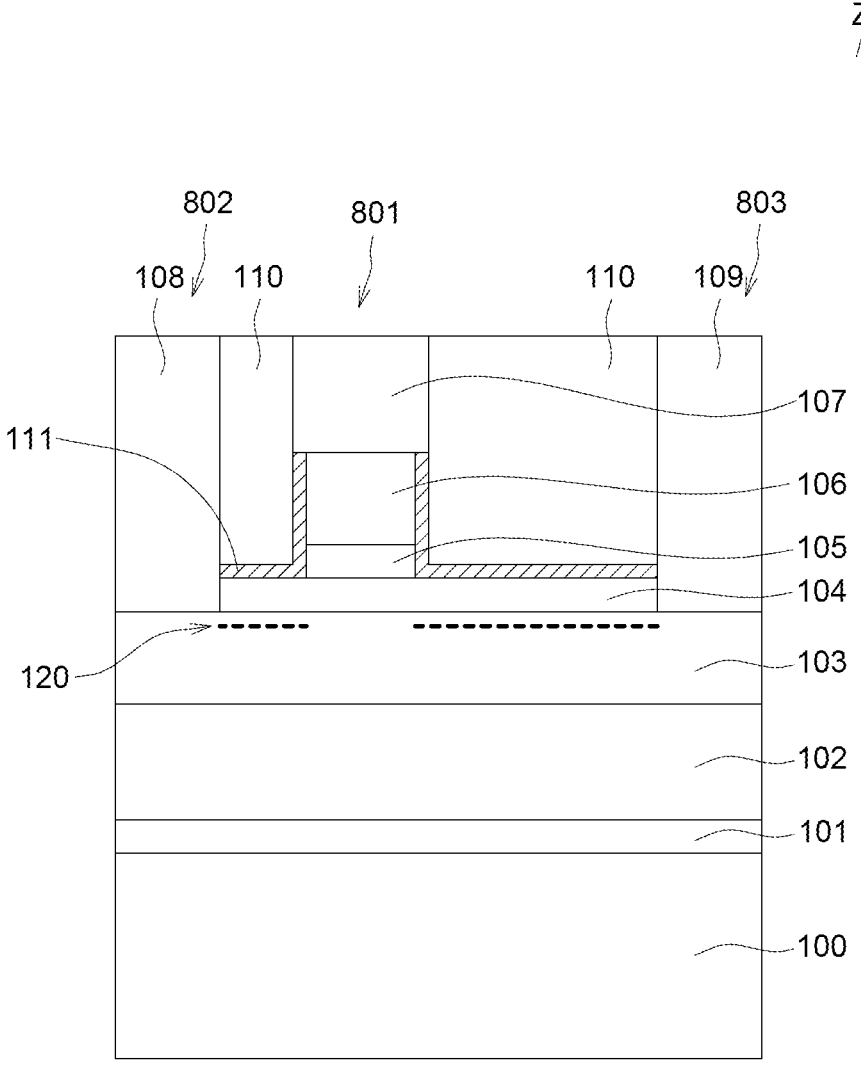

Please refer to FIG. 11, a source/drain element 108 is formed in the opening 802. A source/drain element 109 is formed in the opening 803. For example, the source/drain element 108 and a source/drain element 109 may be formed by a chemical vapor deposition process or a physical vapor deposition process. In an embodiment, the source/drain element 108 fills the opening 802, and the source/drain element 108 may directly contact the dielectric layer 110, the passive layer 111, the first barrier layer 104 and the channel layer 103; the source/drain element 109 fills the opening 803, and the source/drain element 109 may directly contact the dielectric layer 110, the passive layer 111, the first barrier layer 104 and the channel layer 103. The source/drain element 108 and source/drain element 109 may include conductive materials, such as aluminum (Al), copper (Cu), nickel (Ni), platinum (Pt), palladium (Pd), iridium (Ir), molybdenum (Mo), gold (Au), titanium (Ti) or titanium nitride (TiN). In an embodiment, the semiconductor device

10 shown in FIG. 1 is provided through the method schematically illustrated in FIGS. 4-11.

In another embodiment, the present disclosure can be applied to a semiconductor device including two or more barrier layers. The difference between the manufacturing method for a semiconductor device including three barrier layers and the method shown in FIGS. 4-11 is that, the manufacturing method for a semiconductor device including three barrier layers may include forming a third barrier layer 212 on an upper surface 105u of the second barrier layer 105 before the formation of the control layer 106 and after the formation of the second barrier layer 105, which results in a semiconductor material stack shown in FIG. 12.

The third barrier layer 212 may include a third material. The third material may include AlN, GaN, InN, AlGaN, AlInN, GaInN or AlGaInN. In an embodiment, the third material of the third barrier layer 212 may include an aluminum-containing material, and the formation of the third barrier layer 212 may include: a precursor including aluminum is provided to the upper surface 105u of the second barrier layer 105; the precursor including aluminum reacts with other reactants to form the third barrier layer 212. In an embodiment, the concentration of the precursor including aluminum may be a constant, that is, the concentration of the precursor including aluminum would not change with the increase of processing time. In another embodiment, the concentration of the precursor including aluminum may decrease as the processing time increases. For example, the concentration of the precursor including aluminum may linearly or stepwise decrease as the processing time increases.

Figure 12:
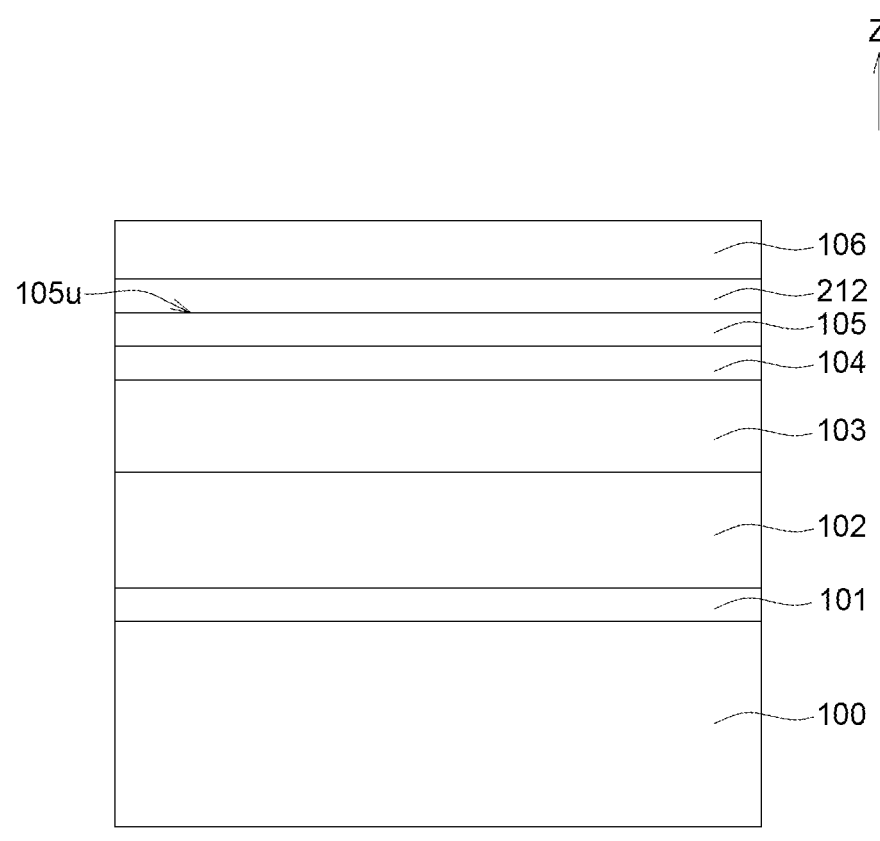
FIG. 12 schematically illustrates a method for manufacturing a semiconductor device according to another embodiment of the present disclosure.

The subsequent steps applied to the semiconductor material stack shown in FIG. 12 can be deduced according to the steps shown in FIGS. 4-11, and the semiconductor device 10' as shown in FIG. 3 may be obtained.

In a comparative example (comparative example 1), the transistor structure of the semiconductor device includes only one barrier layer between the channel layer and the control layer. This barrier layer is usually damaged in the manufacturing process of the semiconductor device, for example, the barrier layer is damaged so that the thickness of the barrier layer decreases, which results in problems like insufficient concentration of two-dimensional electron gas, high on-resistance, low threshold voltage, etc. In another comparative example (comparative example 2), the transistor structure of the semiconductor device includes only one barrier layer between the channel layer and the control layer, and this barrier layer has a thickness larger than the thickness of the barrier layer of the comparative example 1. With a thicker barrier layer, the concentration of two-dimensional electron gas in the comparative example 2 may be increased; however, this configuration makes the concentration of the two-dimensional electron gas in the gate region too high and thus it is difficult to turn off the transistor structure.

The present disclosure provides a semiconductor device including two or more barrier layers. The one or more barrier layer(s) farther from the channel layer (such as the aforementioned second barrier layer and/or third barrier layer) may be used as an etching sacrificial layer for protecting the barrier layer closer to the channel layer (such as the aforementioned first barrier layer) from being damaged, thereby preventing problems like insufficient concentration of two-dimensional electron gas, high on-resistance, low threshold voltage, etc. Moreover, as compared with the material of the barrier layer closer to the channel layer (such as the aforementioned first barrier layer), the material(s) of the one or more barrier layer(s) farther from the channel layer (such as the aforementioned second barrier layer and/or third barrier layer) has lower band gap, which can keep the concentration of the two-dimensional electron gas in the gate region at an appropriate level that is easy to control, and can reduce the on-resistance of the semiconductor device and increase the threshold voltage of the semiconductor device. Furthermore, as compared with the material of the barrier layer closer to the channel layer (such as the aforementioned first barrier layer), the material(s) of the one or more barrier layer(s) farther from the channel layer (such as the aforementioned second barrier layer and/or third barrier layer) is thinner and/or has a lower aluminum content (in the case of all of the barrier layers including aluminum-containing materials), which helps to keep the concentration of the two-dimensional electron gas in the gate region at an appropriate level that is easy to control, and reduce the on-resistance of the semiconductor device and increase the threshold voltage of the semiconductor device. Therefore, with the arrangement of several barrier layers, the electrical performance (such as low on-resistance and high threshold voltage) of the semiconductor device according to the present disclosure can be improved effectively, the semiconductor device is easy to control, and the power consumption can be reduced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
a substrate;
a channel layer on the substrate;
a first barrier layer on the channel layer;
a second barrier layer on the first barrier layer;
a gate element on the second barrier layer; and
a passive layer disposed conformally along a sidewall of the second barrier layer and an upper surface of the first barrier layer,
wherein the first barrier layer comprises a first material with a first band gap, the second barrier layer comprises a second material with a second band gap, and the first band gap is greater than the second band gap, the first barrier layer has a first aluminum content, the second barrier layer has a second aluminum content, and the first aluminum content is greater than the second aluminum content.

2. The semiconductor device according to claim 1, further comprising a control layer between the second barrier layer and the gate element, wherein the control layer comprises GaN doped with p-type dopants, and the channel layer comprises GaN.

3. The semiconductor device according to claim 1, wherein the first material includes AlN, GaN, InN, AlGaN, AlInN, GaInN or AlGaInN.

4. The semiconductor device according to claim 1, wherein the first material comprises $Al_aGa_{1-a}N$, the second material comprises $Al_bGa_{1-b}N$, and a is greater than b.

5. The semiconductor device according to claim 4, wherein a and b are constants.

6. The semiconductor device according to claim 4, wherein b linearly decreases from a bottom surface of the second barrier layer toward a direction away from the first barrier layer.

7. The semiconductor device according to claim 4, wherein b stepwise decreases from a bottom surface of the second barrier layer toward a direction away from the first barrier layer.

8. The semiconductor device according to claim 4, wherein a is greater than or equal to 0.20, and b is smaller than 0.20.

9. The semiconductor device according to claim 4, wherein a is greater than or equal to 0.18, and b is smaller than 0.18.

10. The semiconductor device according to claim 1, further comprising a dielectric layer on an upper surface of the passive layer, wherein the gate element directly contacts the dielectric layer and the passive layer.

11. The semiconductor device according to claim 10, further comprising a first source/drain element and a second source/drain element on opposite sides of the first barrier layer, wherein the first source/drain element and the second source/drain element directly contact the dielectric layer and the passive layer.

12. The semiconductor device according to claim 10, wherein the dielectric layer is on a sidewall of the gate element and a sidewall of the passive layer.

13. The semiconductor device according to claim 1, wherein the first barrier layer has a first thickness, the second barrier layer has a second thickness smaller than the first thickness.

14. The semiconductor device according to claim 1, further comprising a third barrier layer, wherein the second barrier layer is between the first barrier layer and the third barrier layer, the third barrier layer comprises a third material with a third band gap, and the third band gap is smaller than the first band gap.

15. The semiconductor device according to claim 1, wherein the second barrier layer partially covers the upper surface of the first barrier layer.

16. The semiconductor device according to claim 1, wherein the second material includes AlN, GaN, InN, AlGaN, AlInN, GaInN or AlGaInN.

* * * * *